United States Patent [19]

Imhauser

[11] Patent Number: 5,328,857
[45] Date of Patent: Jul. 12, 1994

[54] METHOD OF FORMING A BILEVEL, SELF ALIGNED, LOW BASE RESISTANCE SEMICONDUCTOR STRUCTURE

[75] Inventor: William P. Imhauser, Ambler, Pa.

[73] Assignee: SGS-Thomson Microelectronics, Inc., Carrollton, Tex.

[21] Appl. No.: 951,162

[22] Filed: Sep. 25, 1992

[51] Int. Cl.[5] .......................................... H01L 21/265
[52] U.S. Cl. ...................................... 437/31; 437/38; 437/55; 437/36; 437/154; 148/DIG. 10; 148/DIG. 102
[58] Field of Search ........................ 437/31, 51, 27, 36, 437/80, 909, 150, 151, 154, 162, 924, 55, 38; 148/DIG. 10, DIG. 102

[56] References Cited

U.S. PATENT DOCUMENTS

| | | | |
|---|---|---|---|
| 4,433,470 | 2/1984 | Kameyama et al. | 437/55 |
| 4,433,471 | 2/1984 | Ko et al. | 437/38 |
| 4,510,016 | 4/1985 | Chi et al. | 437/38 |
| 4,539,742 | 9/1985 | Kamzaki et al. | 437/55 |
| 4,625,388 | 12/1986 | Rice | 437/38 |

FOREIGN PATENT DOCUMENTS

| | | |
|---|---|---|
| 0372476 | 6/1990 | European Pat. Off. . |
| 0438693 | 7/1991 | European Pat. Off. . |
| 0249370 | 10/1988 | Japan ..................... 437/31 |

OTHER PUBLICATIONS

1992 Symposium on VLSI Technology, Digest of Technical Papers, Jun. 2, 1992, Seattle, pp. 54–55.

Primary Examiner—Brian E. Hearn
Assistant Examiner—Tuan Nguyen
Attorney, Agent, or Firm—Allan Ratner; Lisa K. Jorgenson; Richard K. Robinson

[57] ABSTRACT

A semiconductor device is manufactured with precisely formed base and emitter regions. This is accomplished by arranging a plurality of insulator layer portions to form a plurality of windows. A dopant is then applied to the semiconductor device between the windows in order to accurately position emitter regions relative to base regions. In this manner a base of controlled dimensions can be formed. Thus the parasitic resistance of the base can be reduced and the figure of merit (emitter periphery/base area) can be increased.

5 Claims, 3 Drawing Sheets

METHOD OF FORMING A BILEVEL, SELF ALIGNED, LOW BASE RESISTANCE SEMICONDUCTOR STRUCTURE

FIELD OF THE INVENTION

The present invention relates to semiconductor devices, and more particularly, to a method of manufacturing a semiconductor device having automatically aligned structures.

BACKGROUND OF THE INVENTION

It is known in the semiconductor art that figures of merit may be used to describe the performance of a semiconductor device. One figure of merit of particular interest is defined as the numerical ratio between the emitter periphery (EP) and the base area (BA). By increasing the figure of merit, a device demonstrates improved current handling capability. Thus, a device is able to handle high power with low parasitic capacitance. In addition, such a device is highly suitable for high frequency applications (for example, at radio frequencies).

One way of increasing a device's figure of merit is by decreasing the "pitch" or spacing between repetitive patterns, i.e.-emitters. Due to the fact that integrated circuits typically have a planar structure, current that flows from the emitter to the collector typically travels parallel to the surface of the wafer after being transported vertically through the base. This current then flows upward towards a contact located on the wafer surface. Due to the significant resistivity of current-flow paths within the device, parasitic series resistances exist.

One such parasitic resistance is the so-called intrinsic base region ($R_{BB}$). This resistance is caused by the path length between the base contact and the edge of the injecting emitter region and is related to base sheet resistance. Thus, by decreasing the pitch, or spacing between emitters, the length of the aforementioned path is decreased, resulting in a decreased parasitic resistance in that region.

The base area of a device may be readily decreased using appropriate photolithographic processes. However, current photolithographic processes are unable to produce device features smaller than 1 micron.

Although a reduced base area results in an increased figure of merit, a base area which is too small may lead to poor device performance. In particular, the spacings from base contact to emitter edge are large enough to allow a small amount of depletion so that proper device operation is obtained. Furthermore, if the spacing in selected portions of the device reaches zero, a short may occur, causing the device to become completely inoperative.

As an alternative to varying the distances in the intrinsic base region, some investigators have attempted to reduce the parasitic resistance of this region by selectively adding dopants to this region. This has been done in order to increase this region's conductivity. However, if the intrinsic base is doped too heavily a low emitter-base breakdown voltage may result, since this breakdown is a strong function of the high resistivity side of the junction, in this case, the base.

SUMMARY OF THE INVENTION

A semiconductor device is manufactured by placing an insulating layer over a portion of a surface region and introducing a dopant to a further portion of the surface region. Selected areas of the further portion of the surface region are covered with insulating layer portions while the uncovered portions of the surface region are isotropically etched to create a plurality of recesses. The insulating layer portions partially overhang the created recesses. A dopant is added to form a base. A further dopant is then added between the overhanging portions of the insulating layer to form a plurality of emitter zones.

DESCRIPTION OF THE DRAWINGS

FIG. 6B additionally indicates exemplary contact connections. FIG. 6A is a cross sectional view of FIG. 6B taken in the plane X—X'.

DETAILED DESCRIPTION

Figure 4:
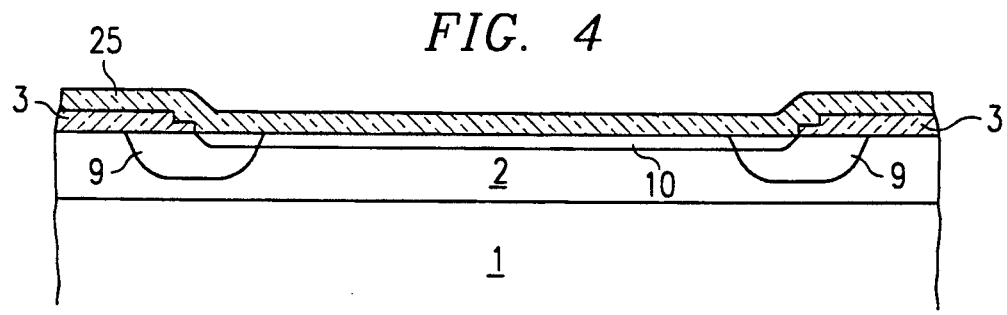
Figure 5:
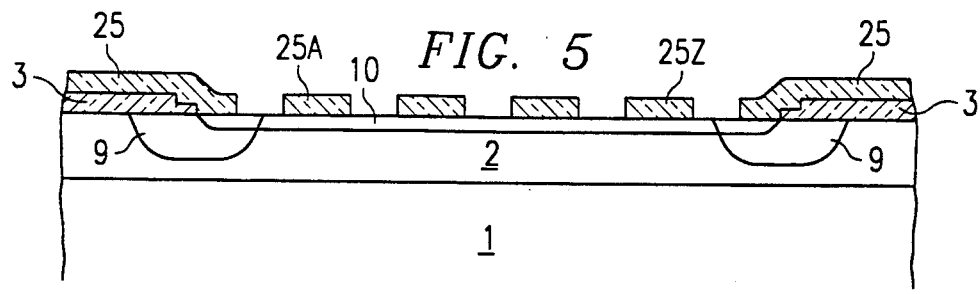
Figure 6A:
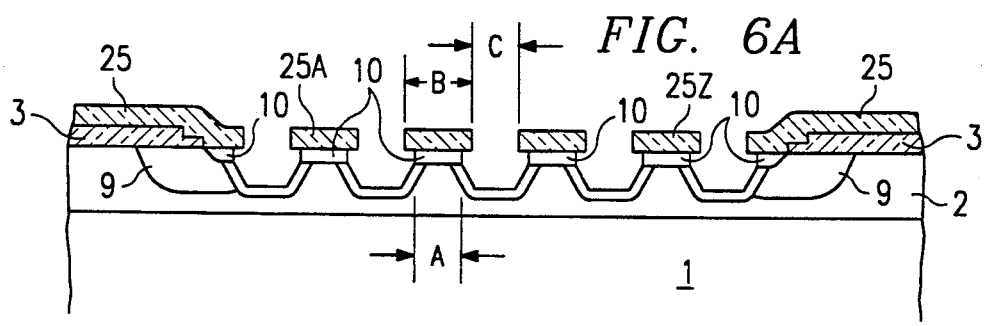
Figure 6B:
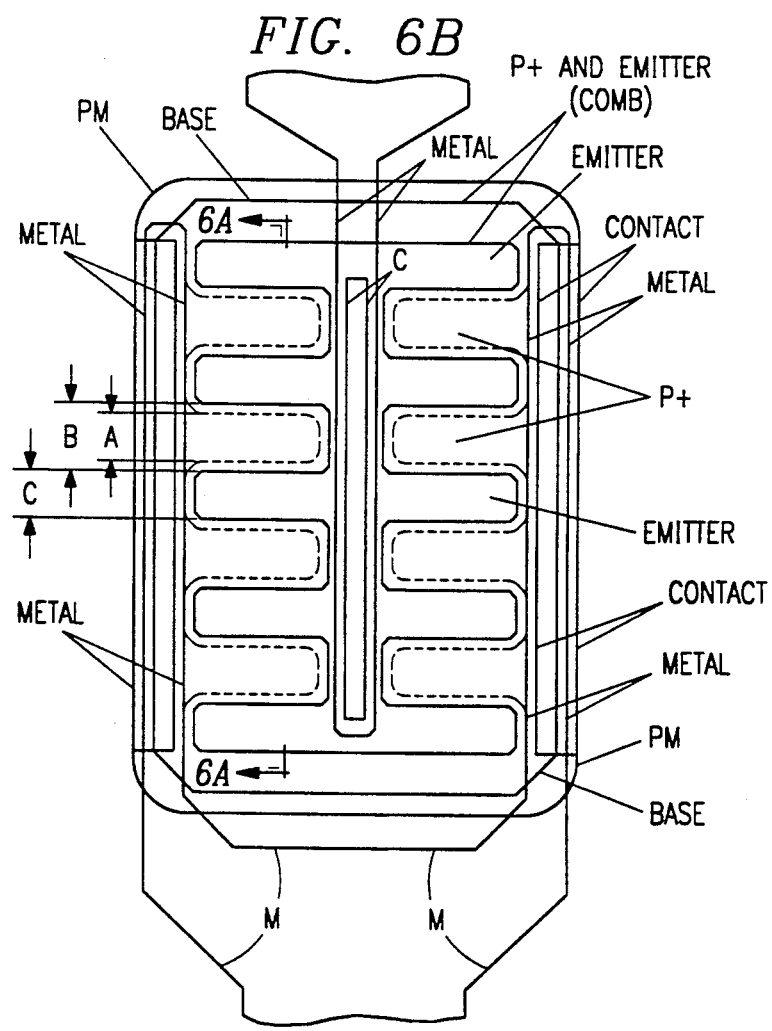
FIG. 6B is a top view of a semiconductor device at the stage of manufacture illustrated by FIG. 6A.
Figure 7:
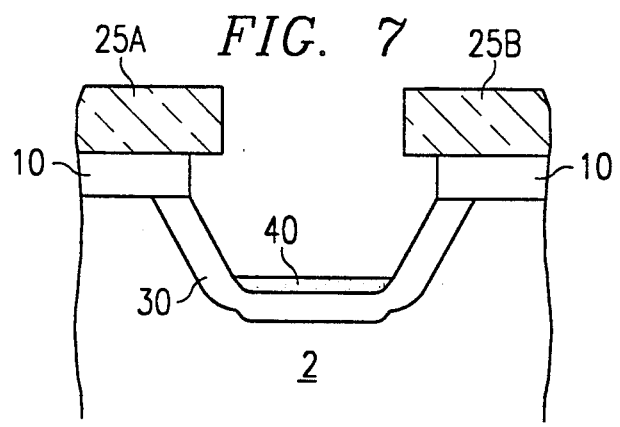
Figure 8:
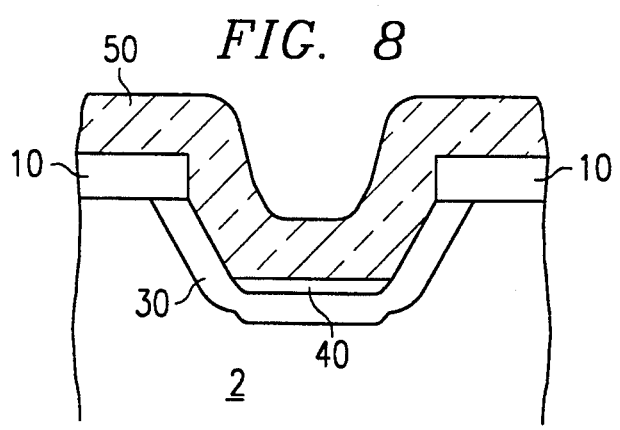
Figure 9:
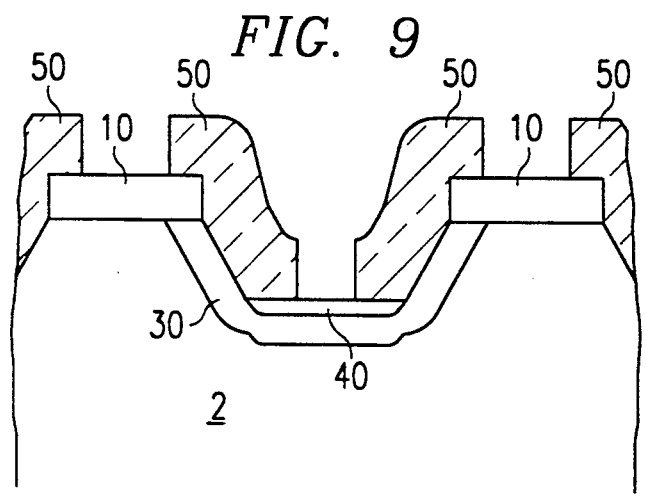

An exemplary embodiment of the present invention will now be described more fully with reference to FIGS. 1-9, in which a semiconductor device is shown during successive stages of manufacture. FIGS. 1-6 show a side view of a relatively large portion of the semiconductor device. FIG. 6B shows a top view of the semiconductor device. FIGS. 7-9 show a relatively close side view of the device, and in particular, provide a detailed view of a portion of the semiconductor device which includes a single emitter. These figures are purely schematic and are not drawn to scale. In particular, the dimensions in the direction of thickness are comparatively strongly exaggerated for the sake of clarity.

A semiconductor device can be manufactured in accordance with an exemplary embodiment of the present invention, in the following manner.

Figure 1:
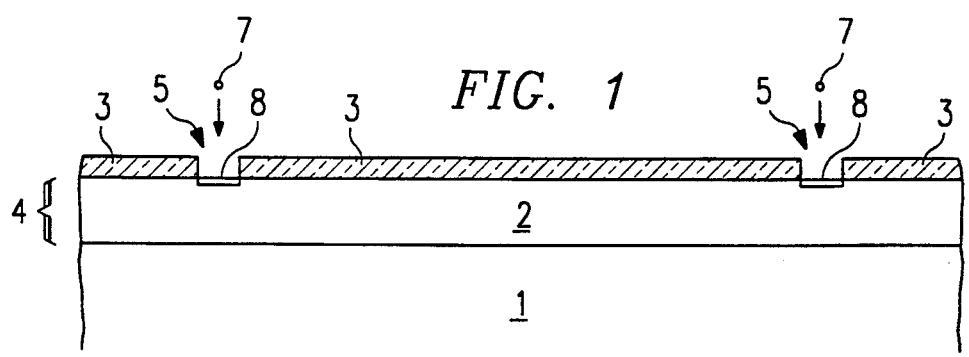
FIGS. 1-5, 6A and 7-9 are cross sectional views illustrating a process for forming a bilevel, self aligned, low base resistance structure in accordance with the present invention.

As shown in FIG. 1, the starting material is a semiconductor wafer, in this example of n-type silicon, including n-type epitaxial silicon layer 2 having a thickness of about 5 microns and a resistivity of about 1 ohm cm, which is grown on a substrate 1 of highly doped n-type silicon having a resistivity of, for example, 0.002 ohm cm. The epitaxial growth method is known in the art, and is not described. Other thicknesses and/or dopings are possible and will be chosen by those skilled in the art in accordance with existing conditions.

Subsequently, an oxide layer 3 is formed on epitaxial layer 2. Oxide layer 3 in this embodiment is a silicon oxide layer having a thickness of, for example, $\frac{1}{2}$ micron and which is formed, for example, by thermal oxidation. Openings 5 are then formed in oxide layer 3 by photolithographic etching.

By means of the implantation of boron ions 7 (dose $5 \times 10^{12}$ atoms/cm$^3$ energy 100 keV) P-minus doping 8 is provided. Oxide layer 3 selectively masks against this implantation.

Figure 2:
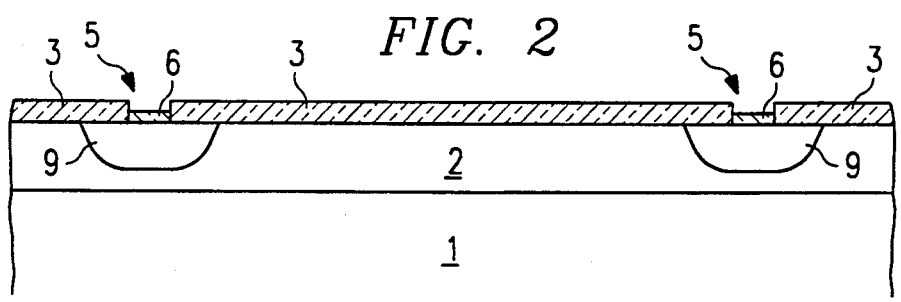

As shown in FIG. 2, breakdown enhancement regions 9 are optionally formed inside silicon layer 2 and substrate 1 using well known diffusion techniques. In an exemplary embodiment of the present invention, the wafer is placed in a diffusion furnace so as to diffuse the low conductivity P- diffusion region into the wafer. This diffusion step is preferably performed in a nitrogen and an oxygen environment. During the diffusion step, an oxide coating 6 is formed in previously exposed openings 5.

Figure 3:
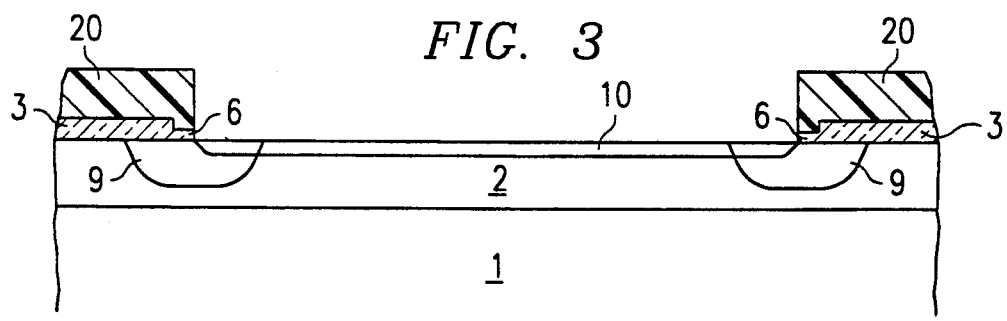

As shown in FIG. 3, a photoresist 20 is formed over selected portions of oxide layer 3. The wafer is then subjected to an etching ambient, causing the exposed portions of oxide layer 3 to be removed. The wafer is then subjected to a P+ implant, such as boron-11($B^{11}$)—$5 \times 10^{15}$—25 KeV, to form P+ region 10. Then, as shown in FIG. 4, photoresist 20 is removed and another oxide layer 25 is deposited via low temperature (350–400 C) glass deposition. Oxide layer 25 is preferably formed with a thickness ranging from 1500 to 2500 angstroms. As shown in FIG. 5, selected portions of oxide layer 25 are then removed, thus exposing the sites at which the emitters will be formed. Thus, selected portions of oxide layer 25 (portions 25 a–z) remain.

With oxide portions 25 a–z being used as a plurality of masks, the wafer is subjected to isotropic etching. This is shown in FIG. 6A. For the purpose of semiconductor manufacture, surface preparation for the etch is particularly desirable to the generation of a smooth silicon surface for the base and emitter implants. If the surface is damaged, poor radio frequency device performance as well as direct current parameter degradation may result. Furthermore, because it has been determined that the surface prior to etch is desirably exceptionally clean and free of oxide, oxide removal may be accomplished immediately prior to the dry etch step.

By subjecting wafer 1 to isotropic etching, portions of P+ region 10 and substrate 2 are removed. Because the etching is isotropic, oxide portions 25 a–z each extend above portions of exposed substrate 1. Thus, oxide portions 25 a–z form a plurality of "overhanging shelves". These shelves define a plurality of windows through which ion implantation may occur. The inventor has found that the dimensions of these shelves can be tightly controlled by using an appropriate etchant. In an exemplary embodiment of the present invention, this etchant is a gas mixture comprising tetrafluoromethane ($CF_4$) halocarbon 13B1 and oxygen ($O_2$) in ratios of approximately 90:5:5% (by weight).

Furthermore, in an exemplary embodiment of the present invention, this etch is accomplished with a Tegal 700 etcher. Using the aforementioned gas mixture, a two part vertical for one part lateral etch ratio is obtained. It is extremely desirable to obtain this type of "sloped" edge to maintain good step coverage for later metalization.

After completing the etching step, a base implant is provided to ensure that there is a continuous current path to the remaining portion of silicon layer 2. This continuous current path is extremely desirable because the current flow between the emitter and the base depends on the continuity of the base between the emitter and the P+ implant. Furthermore, the base implantation energy is desirably chosen to allow at least partial penetration of the overhanging shelves formed by oxide portions 25 a–z.

In a further exemplary embodiment of the present invention, the wafer is treated with a P type doping impurity to diffuse a P-type region 30 into the base site. By diffusing the P-type region, a continuous base is automatically created from the P+ region to the emitter. Furthermore, by using diffusion instead of implantation, a deeper base may be formed in the area not shielded by the shelf. This treatment is particularly desirable for low frequency devices.

A top view of the semiconductor device at the stage of manufacture corresponding to FIG. 6A is illustrated by FIG. 6B. FIG. 6B additionally indicates exemplary contact connections. FIG. 6A is a cross sectional view of FIG. 6B taken in the plane X-X'. Corresponding letters in FIGS. 6A and 6B are used to refer to corresponding structures.

As a next step, n-type (arsenic) ions are implanted to form emitter region 40. This is shown in FIG. 7. The portion of the wafer shown in FIG. 7 is an enlarged view of the wafer shown in FIG. 6. As previously described, the overhanging shelves of oxide layers 25a–z shown in FIG. 7 ensure precise positioning (self-alignment) of the emitter peripheries in P+ region 30.

After removing oxide portions 25 a–z by a dip etch, another oxide layer 50 is deposited. This is shown in FIG. 8. Selected portions of oxide layer 50 are then removed (using, for example, photolithography) as shown in FIG. 9. In this manner, device isolation is achieved. The base, emitter and P+ regions are then driven simultaneously. In another exemplary embodiment of the present invention, the base and P+ regions are partially driven prior to implantation of the emitter region. In a still further exemplary embodiment of the present invention, oxide portions 25 a–z are not removed and oxide layer 50 is deposited directly on oxide portions 25 a–z. This is because, for example, discontinuities may result in metalization layers applied above oxide portions 25a–z. In some devices, however, (for example, overlay devices) the non-removal of oxide portions 25 a–z does not substantially effect device performance.

By forming a semiconductor device in this manner, the various structures within this device can be carefully aligned. Thus, the intrinsic base region can be formed with a length of approximately 1000 angstroms, thus resulting in a 40% increase in the maximum frequency capabilities over prior art devices. In addition, the figure of merit of a device formed using the above described method can be as high as 15. This results in an additional 40% increase in maximum frequency capabilities over prior art devices. These increases in frequency capabilities may result in a doubling of gain in the device. This results in a half-octave-improvement in frequency capability (i.e. increasing maximum frequency of operation from 4 GHZ to 6 GHZ for silicon technology).

In addition, because of the self alignment features, improved injection uniformity is achieved.

Furthermore, the processing steps of the present invention are significantly simplified over that of many prior art devices, thus reducing the number of photoresist, process and high temperature steps.

While the invention has been described in terms of an exemplary embodiment, it is contemplated that it may be practiced as outlined above with modifications within the spirit and scope of the appended claims.

What is claimed:

1. A method of manufacturing a vertically diffused semiconductor device, said method comprising the steps of:

a) providing a semiconductor wafer which includes a surface region of a first conductivity type;

b) providing an insulating layer over a portion of said surface region;

c) introducing a dopant to a further portion of said surface region;

d) covering selected areas of said further portion of said surface region, wherein each of said selected areas is covered with a respective one of a plurality of insulating layer portions;

e) etching said surface region to remove still further portions of said surface region to create a plurality of recesses in said surface region wherein a portion of each of said insulating portions extends above a portion of a respective one of said plurality of recesses so that said plurality of insulating layer portions form a plurality of windows;

f) introducing through said extending portion of each of said insulating portions and through said plurality of windows a first conductivity dopant to form a plurality of base regions in said surface region; and g) introducing a second conductivity dopant opposite in conductivity to said first conductivity dopant exclusively through said plurality of windows to form a plurality of emitter regions, each of said emitter regions positionally corresponding to a respective one of said plurality of windows and positionally aligned relative to a respective one of said plurality of base regions, in order to form a vertically diffused semiconductor device.

2. The method of claim 1 wherein in step e) said etching step is performed using a gas mixture.

3. The method of claim 1, further comprising the step of removing each of said insulating layer portions.

4. The method of claim 1, further comprising the step of depositing an additional layer over further selected areas of said semiconductor device.

5. The method of claim 1, wherein said semiconductor wafer includes at least one collector region.

* * * * *